(12) United States Patent
Jang et al.

(10) Patent No.: US 7,649,789 B2
(45) Date of Patent: Jan. 19, 2010

(54) SEMICONDUCTOR MEMORY DEVICE WITH VARIOUS DELAY VALUES

(75) Inventors: Ji-Eun Jang, Kyoungki-do (KR); Kyung-Whan Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 105 days.

(21) Appl. No.: 11/819,802

(22) Filed: Jun. 29, 2007

(65) Prior Publication Data
US 2008/0159025 A1 Jul. 3, 2008

(30) Foreign Application Priority Data
Dec. 27, 2006 (KR) .................. 10-2006-0134360

(51) Int. Cl.
G11C 7/00 (2006.01)
G11C 7/10 (2006.01)
G11C 29/00 (2006.01)

(52) U.S. Cl. .................. 365/194; 365/189.08; 365/191; 365/193; 365/195; 365/201

(58) Field of Classification Search .................. 365/191, 365/193, 194, 195, 196, 201
See application file for complete search history.

(56) References Cited

U.S. PATENT DOCUMENTS

| 5,530,677 | A | * | 6/1996 | Grover et al. | .......... 365/233.12 |
| 6,061,295 | A | * | 5/2000 | Roh | ................ 365/230.03 |
| 6,157,992 | A | * | 12/2000 | Sawada et al. | ............... 711/167 |
| 6,269,462 | B1 | * | 7/2001 | Shimizu et al. | ............. 714/727 |
| 2002/0135394 | A1 | * | 9/2002 | Ahn et al. | .................... 324/765 |
| 2003/0026161 | A1 | * | 2/2003 | Yamaguchi et al. | ..... 365/230.03 |
| 2004/0000932 | A1 | * | 1/2004 | Jang | ........................... 326/105 |
| 2005/0168259 | A1 | | 8/2005 | Yamawaki | |
| 2005/0229065 | A1 | * | 10/2005 | Kai et al. | ..................... 714/742 |
| 2007/0064505 | A1 | * | 3/2007 | Versen et al. | ............... 365/194 |
| 2008/0002494 | A1 | * | 1/2008 | Yun | .......................... 365/203 |

FOREIGN PATENT DOCUMENTS

| JP | 02-1569815 | 6/1990 |
| JP | 2003-273712 | 9/2003 |
| JP | 2005-348296 | 12/2005 |
| KR | 10-2003-0059488 A | 7/2003 |
| KR | 10-2005-0086300 A | 8/2005 |
| KR | 10-2006-0016656 A | 2/2006 |
| KR | 10-2007-0002943 A | 1/2007 |
| KR | 2007077982 A * | 7/2007 |
| KR | 10-2008-0001055 | 1/2008 |

OTHER PUBLICATIONS

Korean Office Action issued in Korean Patent Application No. KR 10-2006-0134360, dated on Feb. 29, 2008.

* cited by examiner

Primary Examiner—Ly D Pham
(74) Attorney, Agent, or Firm—IP & T Law Firm PLC

(57) ABSTRACT

A memory device includes a delay circuit and a delay selection unit. The delay circuit delays a pulse signal to generate a delayed pulse signal. The pulse signal is used to generate a write enable signal and a read enable signal. The delay selection unit selects one of the delayed pulse signal output from the delay circuit in a test mode and the pulse signal in a normal mode.

13 Claims, 4 Drawing Sheets

SEMICONDUCTOR MEMORY DEVICE WITH VARIOUS DELAY VALUES

CROSS-REFERENCE TO RELATED APPLICATION

The present invention claims priority of Korean patent application number 10-2006-0134360, filed on Dec. 27, 2006, which is incorporated by reference in its entirety.

BACKGROUND OF THE INVENTION

The present invention relates to a semiconductor memory device; and, more particularly, to a device for improving a speed margin at an operating voltage of the memory device.

In general, a memory device carries out a burn-in test by applying a power supply voltage higher than an operating power supply voltage in order to perform a stress test. At this time, the operations such as read, write and so on are done by applying a power supply voltage higher than an operating power supply voltage, and will be described below.

FIG. 1 is a circuit diagram for explaining read/write operations in a conventional memory device.

As shown in the drawing, a write enable signal bwen is generated by combining a pulse signal byprep and a discrimination signal wt_rdb by a NAND gate NA11 and an inverter I11. And, a read enable signal isotb is produced by combining the pulse signal byprep and an inverted signal of the discrimination signal wt_rdb done by an inverter I12 by a NAND gate NA12 and an inverter I13. That is, the write enable signal bwen is generated in the section where both the pulse signal byprep and the discrimination signal wt_rdb are a logic high level and the read enable signal isotb is created in the section where the signal byprep is a logic high level and the discrimination signal wt_rdb is a logic low level.

Here, the pulse signal byprep is the one that is generated when an external command for read/write operations is inputted, and is used to issue Yi (column selection signal) in the operation of the memory device, to create the read enable signal isotb in the read operation, and to create the write enable signal bwen in the write operation.

In addition, the discrimination signal wt_rdb is to discriminate between the read operation and the write operation. As mentioned above, the write enable signal bwen is generated when the discrimination signal wt_rdb is a logic high level and the read enable signal isotb is created when it is a logic low level.

The write enable signal bwen generated by combining the pulse signal byprep and the discrimination signal wt_rdb is delayed by a delay circuit 110 and applied to a write driver 130 which performs a write operation of the memory device in response to the write enable signal bwen. That is, data on a global input/output line GIO are carried on a local input/output line LIO.

Further, the read enable signal isotb created by combining the pulse signal byprep and the discrimination signal wt_rdb is delayed by a delay circuit 120 and applied to an input/output sense amplifier (IOSA) 140 which performs a read operation of the memory device in response to the read enable signal isotb. That is, the data on the local input/output line LIO is brought on the global input/output line GIO.

The write enable signal bwen and the read enable signal isotb generated by the pulse signal byprep and the discrimination signal wt_rdb are provided through the delay circuits 110 and 120, and are delayed without using a capacitor or resistor because these signals are all pulse signals. Therefore, the delay circuits 110 and 120 through which those signals are passed employ an inverter chain with inverters coupled in series.

The global input/output line GIO generally has a large metal line loading which enables a delay.

The delay circuits 110 and 120 with the inverter chain, through which the pulse signals are passed, have delay values that change depending on a variation of a power supply voltage. However, the global input/output line GIO with metal line loading has a delay value which does not almost vary even if the power supply voltage is varied.

When the write/read operations of the memory device are tested with a voltage much higher than the operating voltage as in the burn-in test, the delay values of the delay circuits 110 and 120 are highly decreased and the delay value of the global input/output line GIO does not almost vary. Thus, in case the delay values of the pulse signals are set in conformity with the operating voltage, the delay values of the signals are not correct in the burn-in test mode, thereby causing a failure in the write/read operations.

In order to solve the above problems, the conventional memory device sets delay values in conformity with the voltage in the burn-in test, which is higher than the operating voltage. In other words, more delay values than necessary are set because of the operation at the high voltage as in the burn-in test, thereby leading to a loss of speed margin in the general operation.

SUMMARY OF THE INVENTION

Embodiments of the present invention are directed to providing a semiconductor memory device having different delay length according to an operation mode of the semiconductor memory device such as a test mode and a normal mode.

In accordance with an aspect of the present invention, there is provided a memory device including a delay circuit and a delay selection unit. The delay circuit delays a pulse signal to generate a delayed pulse signal. The pulse signal is used to generate a write enable signal and a read enable signal. The delay selection unit selects one of the delayed pulse signal output from the delay circuit in a test mode and the pulse signal in a normal mode.

In accordance with another aspect of the present invention, there is provided a memory device including first and second delay circuits and a first and a second delay selection units. The first delay circuit delays a first pulse signal for use in generating a write enable signal to generate a first delayed pulse signal. The second delay circuit delays a second pulse signal for use in generating a read enable signal to generate a second delayed pulse signal. The first delay selection unit selects the first delayed pulse signal in a test mode and the first pulse signal in a normal mode. The second delay selection unit selects the second delayed pulse signal in a test mode and the second pulse signal in a normal mode

DESCRIPTION OF SPECIFIC EMBODIMENTS

Hereinafter, preferred embodiments of the present invention will be set forth in detail with reference to the accompanying drawings so that the invention can be easily carried out by those skilled in the art to which the invention pertains.

Figure 1:
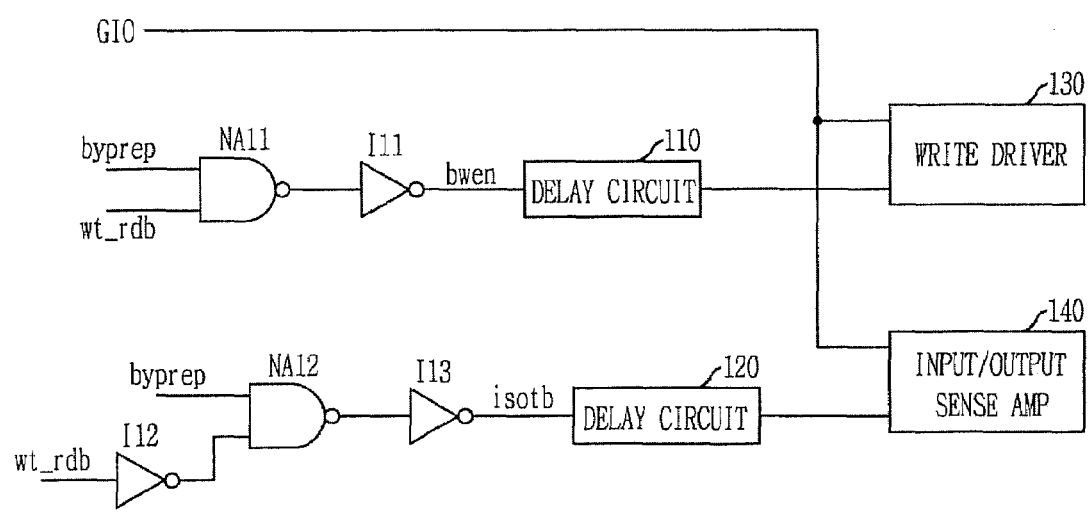
FIG. 1 is a circuit diagram illustrating read/write operations in a conventional memory device.
Figure 2:
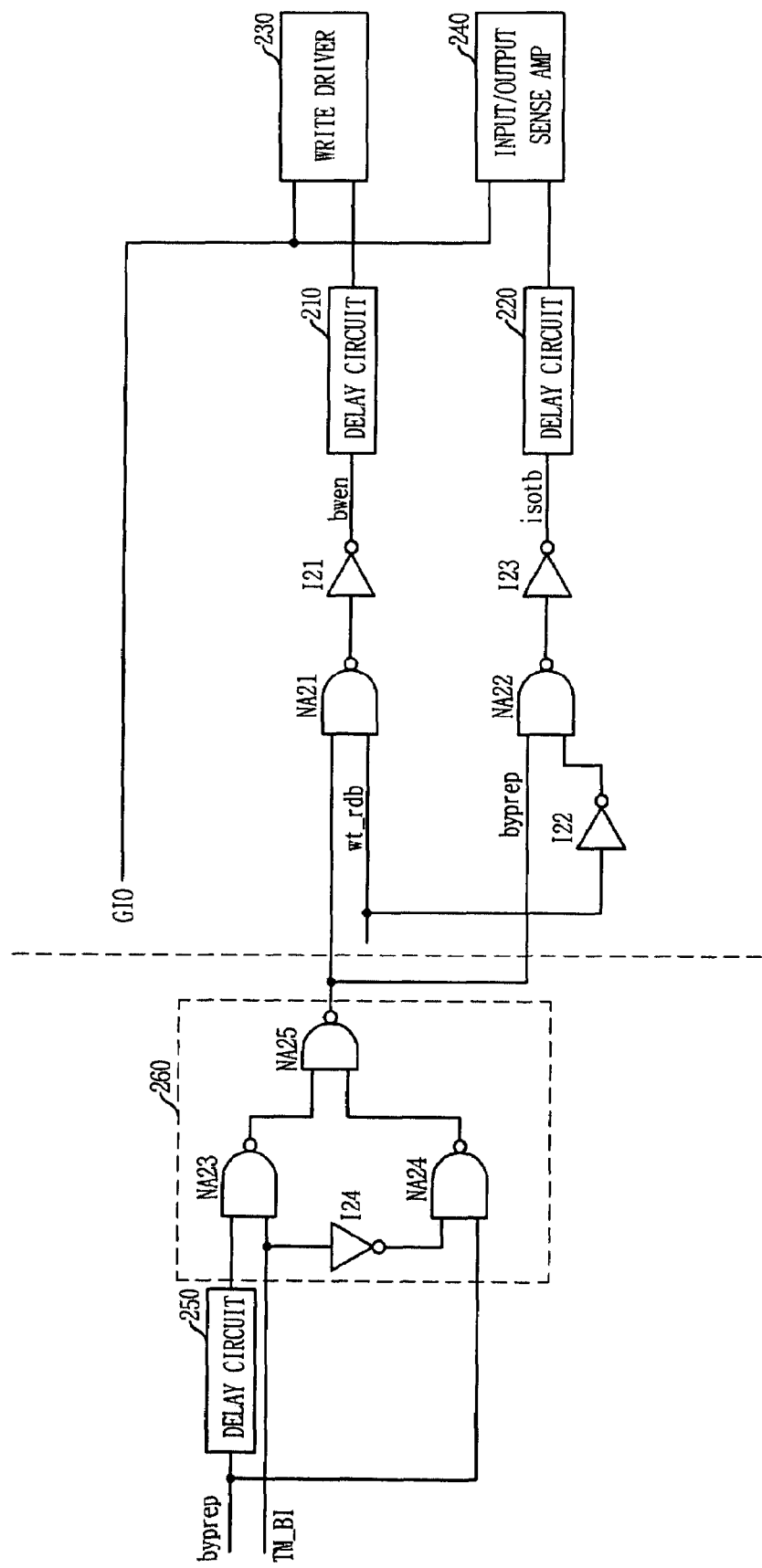
FIG. 2 is a circuit diagram illustrating a memory device in accordance with a preferred embodiment of the present invention.

FIG. 2 is a circuit diagram illustrating a memory device in accordance with a preferred embodiment of the present invention.

In FIG. 2, the left portion of a dotted line is a newly added portion in the memory device in accordance with the present invention and the right portion thereof is the same as the existing memory device. Therefore, since the right portion of the dotted line is described in the prior art section, only the left portion thereof will be described in detail below.

As shown in FIG. 2, the memory device according to one embodiment of the present invention includes a delay circuit 250 for delaying a pulse signal byprep to generate a write enable signal bwen and a read enable signal isotb, and a delay selector 260 for selecting the pulse signal byprep delayed by the delay circuit 250 in a test mode and the non-delayed original pulse signal byprep in a normal mode. By this configuration, a speed margin can be improved in the normal mode.

The test mode implies the mode that performs the read/write operations by applying a high voltage to the memory device, and one example of such test mode is a burn-in test mode.

The delay selector 260 is operated when a burn-in test signal TM_BI which is a signal enabled in the burn-in test mode is inputted thereto, and serves to select the pulse signal byprep delayed by the delay circuit 250 when the burn-in test signal TM_BI is enabled and to select the non-delayed original pulse signal byprep when it is disabled.

The delay selector 260 is provided with NAND gates NA23, NA24, and NA25 for logically combining the pulse signal byprep delayed by the delay circuit 250, the non-delayed original pulse signal byprep and the burn-in test signal TM_BI, and an inverter I24 for inverting the burn-in test signal TM_BI.

Specifically, the delay selector 260 comprises a first NAND gate NA23 taking the pulse signal byprep delayed by the delay circuit 250 and the burn-in test signal TM_BI, a second NAND gate NA24 receiving the non-delayed original pulse signal byprep and an inverted signal of the burn-in test signal TM_BI, and a third NAND gate NA25 accepting outputs of the first and the second NAND gates NA23 and NA24.

In operation, when the burn-in test signal TM_BI is enabled and becomes a logic high level, a logic high signal is applied to the first NAND gate NA23 and a logic low signal is applied to the second NAND gate NA24. When the logic low signal is inputted to the second NAND gate NA24, the second NAND gate NA24 always outputs a logic high signal regardless of the logic level of the other input signal. An output of the first NAND gate NA23 is determined depending on the pulse signal byprep delayed by the delay circuit 250 and inputted thereto. If the pulse signal byprep is a logic high level, an output of the first NAND gate NAND23 becomes a logic low level and if the pulse signal byprep is a logic low level, an output of the first NAND gate NAND23 becomes a logic high level. An output of the third NAND gate NA25 is determined depending on the outputs from the first and the second NAND gates NA23 and NA24. The second NAND gate NA24 continuously outputs a logic high level, and thus, the third NAND gate NA25 inverts the output of the first NAND gate NA23 and outputs the same. Namely, the output of the third NAND gate NA25 becomes the same as the pulse signal byprep delayed by the delay circuit 250.

On the contrary, that is, when the burn-in test signal TM_BI of a logic low level is inputted in the normal mode, the output of the third NAND gate NA25 becomes the pulse signal byprep that is inputted to the second NAND gate NA24. In other words, the non-delayed original pulse signal byprep is provided to the third NAND gate NA25.

As mentioned above, the delay selector 260 serves to increase the delay value of the pulse signal byprep in the burn-in test mode. Therefore, the present invention sets the delay values in conformity with the operating voltage and sets delay values required in the burn-in test mode by the delay circuit 250 newly added according to the invention, without the need for setting large delay values for the burn-in test when setting the delay values of the existing delay circuits 210 and 220. Namely, the delay values of the excising delay circuits 210 and 220 do not need to be set larger than the delay values required for the operating voltage, thereby making it possible to improve the speed margin of the memory device.

In the present invention, only the delay value of the pulse signal byprep is adjusted depending on whether or not the current operation mode is the test mode, but the delay value of the discrimination signal wt_rdb is not adjusted. The reason is because the input timing of the pulse signal byprep is important as it has a pulse form, but the discrimination signal wt_rdb is merely a level signal. In other words, this is because the discrimination signal becomes a logic high level when the write command is inputted and is continuously maintained in a logic high state until the next read command is applied, which does not cause a large problem with timing.

Figure 3:
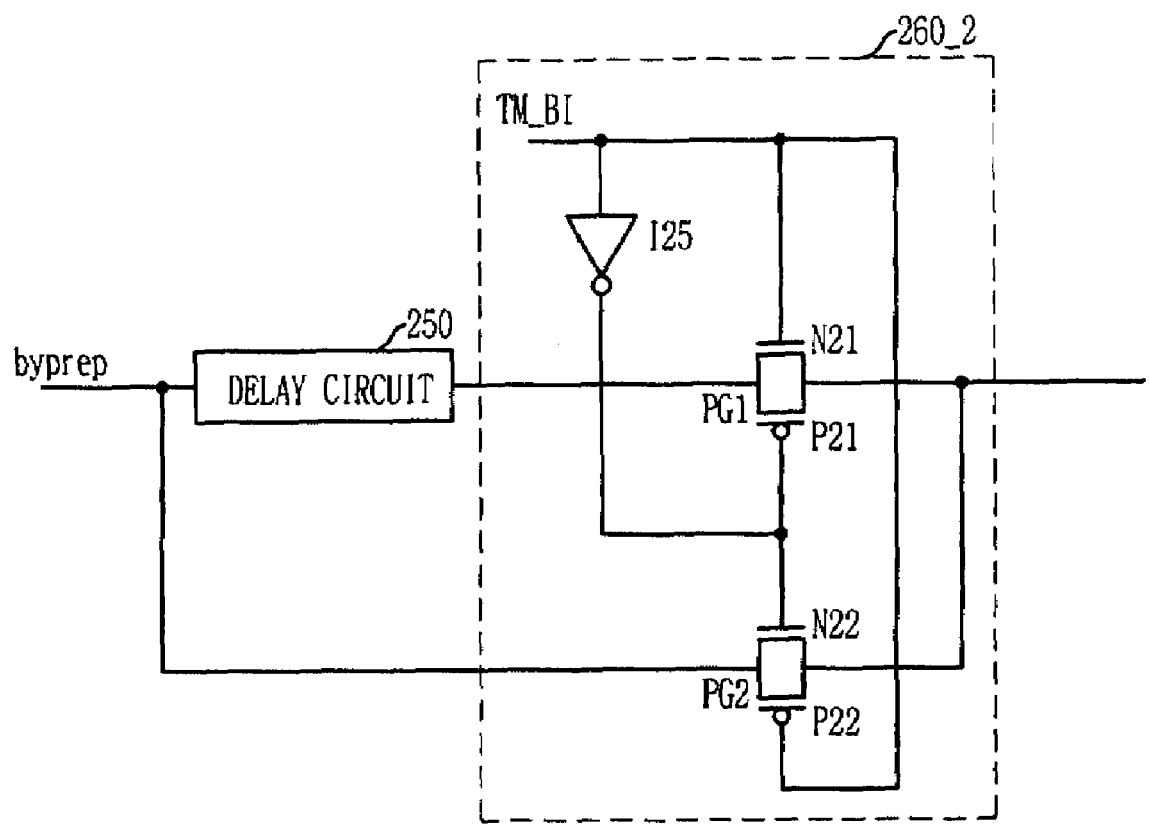
FIG. 3 is a circuit diagram of one example that implements a delay selector by using pass gates unlike that of FIG. 2.

FIG. 3 is a circuit diagram of one example which implements another delay selector by using pass gates differently from that of FIG. 2.

As shown in the drawing, the delay selector 260_2 comprises a first pass gate PG1 which is turned on when the burn-in test signal TM_BI is enabled and transfers the pulse signal byprep delayed by the delay circuit 250 and a second pass gate PG2 which is turned on when the burn-in test signal TM_BI is disabled and transfers the non-delayed original pulse signal byprep.

The first and the second pass gates PG1 and PG2 take the burn-in test signal or the pulse signal via their gates, and can be constituted by NMOS and PMOS transistors N21, N22, P21 and P22 for transferring the pulse signal to its own drain-source transfer line.

Specifically, the first pass gate PG1 can be constituted by an NMOS transistor N21 taking the burn-in test signal TM_BI via its gate and a PMOS transistor P21 receiving the burn-in test signal TM_BI inverted by an inverter I25 via its gate.

Further, the second pass gate PG2 can be constituted by a PMOS transistor P22 accepting the burn-in test signal TM_BI via its gate and an NMOS transistor N22 receiving the burn-in test signal TM_BI inverted by the inverter I25 via its gate.

In operation, when the burn-in test signal TM_BI is enabled to a logic high level, the transistors N21 and P21 are turned on and the first pass gate PG1 is turned on which transfers the pulse signal byprep delayed by the delay circuit 250, and when the burn-in test signal TM_BI is disabled to a logic low level, the transistors N22 and P22 are turned on and the second pass gate PG2 is turned on which transfers the non-delayed original pulse signal byprep.

In other words, only the configuration of the delay selector 206_2 is different from that of the delay circuit 260 shown in FIG. 2, but their roles are identical to each other.

Figure 4:
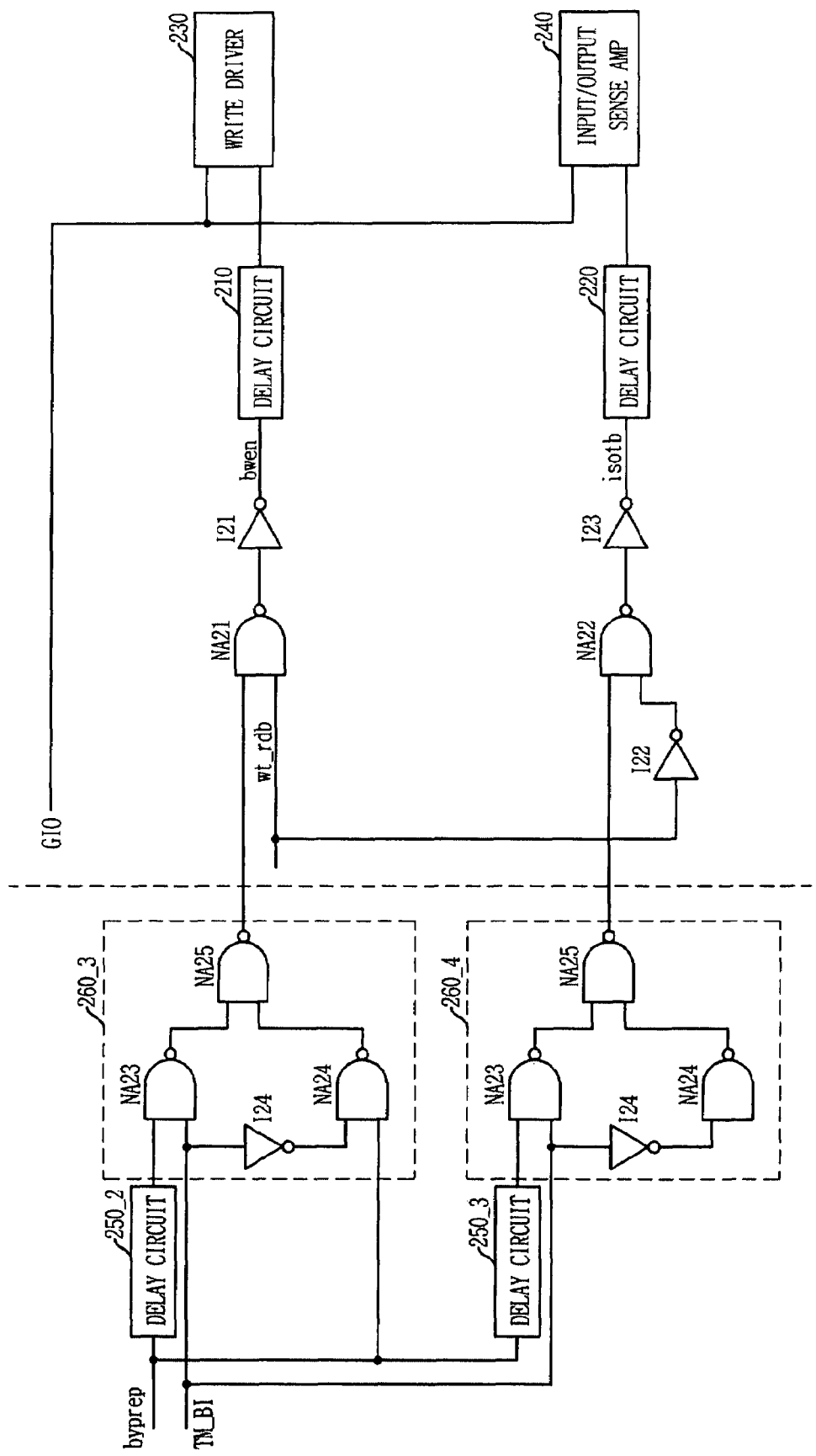
FIG. 4 is a circuit diagram illustrating a memory device in accordance with another preferred embodiment of the present invention.

FIG. 4 is a circuit diagram illustrating a memory device in accordance with another embodiment of the present invention.

As shown in the drawing, the memory device according to another embodiment of the present invention comprises a first delay circuit 250_2 for delaying a pulse signal byprep to generate a write enable signal bwen, a second delay circuit 250_3 for delaying a pulse signal byprep to generate a read enable signal isotb, a first delay selector 260_3 for selecting the pulse signal byprep to generate the write enable signal bwen delayed by the first delay circuit 250_2 in a test mode and the non-delayed original pulse signal byprep in a normal mode, and a second delay selector 260_4 for selecting the pulse signal byprep to create the write enable signal isotb delayed by the second delay circuit 250_3 in a test mode and the non-delayed original pulse signal byprep in a normal mode.

Unlike the embodiment of FIG. 2, the embodiment shown in FIG. 4 is provided with the delay circuits 250_2 and 250_3 and the delay selectors 260_3 and 260_4 for each of two paths, through which the pulse signal byprep is inputted, one of which generates the write enable signal bwen and the other of which generates the read enable signal isotb.

This is to cope with the case where the delay values of the delay circuits 210 and 220, through which the write enable signal bwen and the read enable signal isotb are passed, are different from each other and change according to a variation of voltage. That is, in case there are different delay values to be increased in the burn-in test mode for each of the paths of generating the write enable signal bwen and the read enable signal isotb, the paths are provided with the delay circuits 250_2 and 250_3 and the delay selectors 260_3 and 260_4, respectively, as shown in FIG. 4.

The embodiment of FIG. 4 is different from that of FIG. 2 in that it is provided with the two delay circuits 250_2 and 250_3 and the two delay selectors 260_3 and 260_4. However, since the basic operation that the delay selectors 260_3 and 260_4 select the pulse signal byprep delayed by the delay circuits 250_2 and 250_3 in the burn-in test mode is the same, a separate description—therefor will be omitted here for simplicity.

Further, like the embodiment of the FIG. 2, it is possible that the delay selectors 260_3 and 260_4 shown in FIG. 4 can be implemented in the same manner as shown in FIG. 3.

As described above, according to the present invention, it is possible to increase the delay value of the pulse signal byprep to create the write enable signal bwen and the read enable signal isotb in the burn-in test mode. Accordingly, when setting the delay values of the write enable signal bwen and the read enable signal isotb in the normal mode, the delay values can be set smaller, thereby improving the speed margin of the memory device.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
a delay circuit configured to delay a pulse signal to generate a delayed pulse signal during a test mode, wherein the pulse signal is used to generate a write enable signal and a read enable signal; and
a delay selection unit configured to receive a test signal and to select the delayed pulse signal output from the delay circuit when the test signal is enabled during the test mode and the pulse signal which is non-delayed when the test signal is disabled during a normal mode,
wherein the delay circuit sets delay values of the pulse signal in conformity with operating voltages and the delay selection unit increases the delay values of the pulse signal during the test mode.

2. The memory device as recited in claim 1, wherein the test mode is a burn-in test mode that applies a high voltage to the memory device, and the test signal is a burn-in test signal.

3. The memory device as recited in claim 2, wherein the delay selection unit includes:
a plurality of NAND gates for logically combining the delayed pulse signal, the pulse signal and the burn-in test signal; and
an inverter for inventing the burn-in test signal.

4. The memory device as recited in claim 2, wherein the delay selection unit includes:
a first NAND gate for logically combining the delayed pulse signal and the burn-in test signal;
a second NAND gate for logically combining the pulse signal and an inverted signal of the burn-in test signal; and
a third NAND gate for logically combining outputs of the first and the second NAND gates.

5. The memory device as recited in claim 2, wherein the delay selection unit includes:
a first pass gate, turned on when the burn-in test signal is enabled, for transmitting the delayed pulse signal; and
a second pass gate, turned on when the burn-in test signal is disabled, for transmitting the pulse signal.

6. The memory device as recited in claim 5, wherein each of the first and the second pass gates includes an NMOS transistor and a PMOS transistor.

7. The memory device as recited in claim 1, wherein the write enable signal is generated when both the pulse signal and a write/read discrimination signal have a logic high level, and the read enable signal is generated when the pulse signal has a logic high level and the write/read discrimination signal has a logic low level.

8. A memory device, comprising:
a first delay circuit for delaying a first pulse signal for use in generating a write enable signal to generate a first delayed pulse signal;
a second delay circuit for delaying a second pulse signal for use in generating a read enable signal to generate a second delayed pulse signal;
a first delay selection unit for selecting the first delayed pulse signal in a test mode and the first pulse signal in a normal mode; and
a second delay selection unit for selecting the second delayed pulse signal in a test mode and the second pulse signal in a normal mode.

9. The memory device as recited in claim 8, wherein the test mode is a burn-in test mode that applies a high voltage to the memory device.

10. The memory device as recited in claim 8, wherein the first and the second delay selection units respectively select the first and the second delayed pulse signals when the burn-in test signal is enabled and respectively selects the first and the second pulse signals when the burn-in test signal is disabled.

11. A memory device, comprising:
a delay circuit configured to delay a pulse signal to generate a delayed pulse signal; and a delay selection unit configured to select one of the delayed pulse signal output from the delay circuit during a test mode and the pulse signal output during a normal mode, wherein the delay circuit sets delay values of the pulse signal in conformity with operating voltages and the delay selection unit increases the delay values of the pulse signal during the test mode.

12. A memory device, comprising:

a delay circuit configured to delay a pulse signal to generate a delayed pulse signal; and a delay selection unit configured to select one of the delayed pulse signal output from the delay circuit during a test mode and the pulse signal output during a normal mode, wherein the delay selection unit includes:

a first pass gate that is turned on when a burn-in test signal is enabled and configured to transmit the delayed pulse signal; and a second pass gate that is turned on when the burn-in test signal is disabled and configured to transmit the pulse signal.

13. A memory device, comprising:

a delay circuit configured to delay a pulse signal to generate a delayed pulse signal, wherein the pulse signal is used to generate a write enable signal and a read enable signal; and a delay selection unit configured to select one of the delayed pulse signal output from the delay circuit during a test mode and the pulse signal output during a normal mode, wherein the write enable signal is generated when both the pulse signal and a write/read discrimination signal have a logic high level, and the read enable signal is generated when the pulse signal has a logic high level and the write/read discrimination signal has a logic low level.

* * * * *